Aug. 27, 1974 L. E. TERRY 3,832,230

METHOD FOR IMPROVING GLASS ADHERENCE TO GOLD FILM

Original Filed July 24, 1970

United States Patent Office 3,832,230

Patented Aug. 27, 1974

3,832,230

METHOD FOR IMPROVING GLASS ADHERENCE TO GOLD FILM

Lewis E. Terry, Phoenix, Ariz., assignor to Motorola, Inc., Franklin Park, Ill.

Original application July 24, 1970, Ser. No. 58,102. Divided and this application Mar. 6, 1972, Ser. No. 231,812

Int. Cl. B44d *1/14, 1/18;* C03c *15/00*

U.S. Cl. 117—217 4 Claims

ABSTRACT OF THE DISCLOSURE

A method for improving the adherence of glass to a gold film is disclosed. A layer of a metal such as tantalum is deposited on the gold film. The metal layer is heated in an oxidizing atmosphere to convert the metal to a metal oxide. A layer of glass is then deposited on top of the metal oxide layer.

CROSS REFERENCE TO A RELATED APPLICATION

Figure 1:
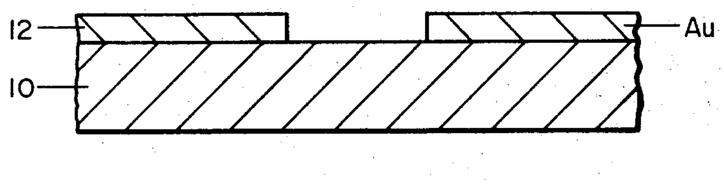

This is a division of application, Ser. No. 58,102, filed July 24, 1970.

BACKGROUND OF THE INVENTION

Gold films are used as metal contacts in semiconductor devices and particularly in integrated circuit devices. In LSI (Large Scale Integrated Circuits) multilayer metallization is required in the integrated circuit structures. In order for the multilayer metallization to be effective, there must be a layer of insulation such as glass between the gold layers. Problems separating two or more layers of gold have arisen due to the lack of satisfactory adherence of the glass insulating layer to the gold film. Failure of the glass to adhere satisfactorily to the gold film causes the glass layer to peel or flake off thereby resulting in device failure.

SUMMARY OF THE INVENTION

It is an object of this invention to provide a method for improving the adherence of glass to gold films.

It is another object of this invention to provide a method of providing multilayer metallization for integrated circuits.

These and other objects are accomplished in accordance with this invention by a method in which a metal such as tantalum, zirconium, niobium or hafnium is deposited on the gold film. The metal film, for example, tantalum, is then heated in an oxidizing atmosphere to form tantalum oxide. A layer of glass is then deposited over the tantalum oxide. The glass adheres to the tantalum oxide which in turn adheres tightly to the gold.

In a preferred embodiment of this invention, after selectively providing openings in the glass and tantalum oxide layers, a second layer of gold is deposited, then a second layer of tantalum is deposited thereon and converted to tantalum oxide. A second layer of glass is also deposited on the tantalum oxide.

These steps may be repeated as often as required for the multilayer metallization system.

IN THE DRAWING

FIGS. 1 through 5 show the various steps of the process in accordance with this invention.

DESCRIPTION OF ILLUSTRATIVE EMBODIMENT

Referring now to the drawings, FIG. 1 shows a substrate 10 of an insulator or ceramic material such as alumina. Substrate 10 may be a semiconductor such as silicon, germanium, or any of the group 3–5 semiconductors such as gallium arsenide, gallium antimide, gallium phosphide, indium antimide, indium phosphide and aluminum arsenide. On top of the substrate 10 is a gold layer 12. If the substrate is silicon, a layer of silicon dioxide (not shown) is required to separate the silicon from the gold layer 12. The gold layer 12 is deposited and etched to form an opening therein by conventional deposition and etching techniques.

Figure 2:
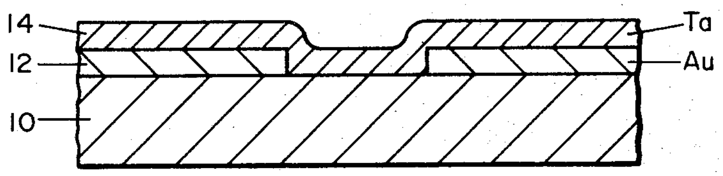

As shown in FIG. 2, a layer of metal 14 is formed on top of the gold layer 12. The layer 14 is of any metal taken from the group consisting of titanium, zirconium, tantalum, tungsten, niobium and hafnium. The preferred metal is tantalum and the invention will be hereinafter described in terms of the tantalum.

Figure 3:
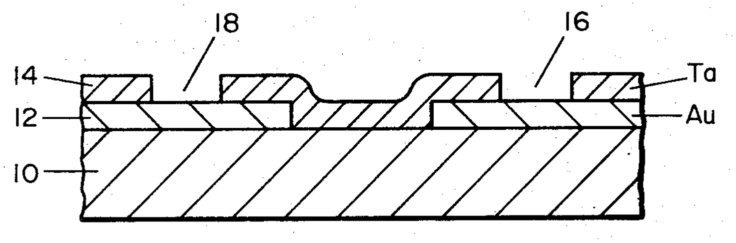
Figure 4:
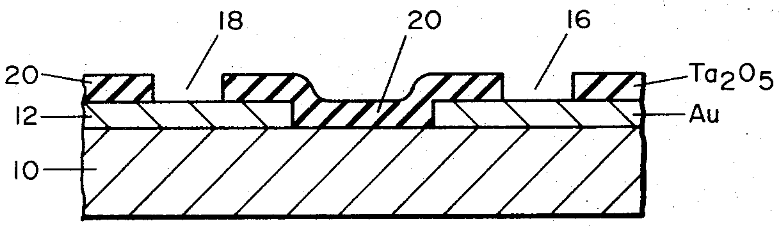
Figure 5:
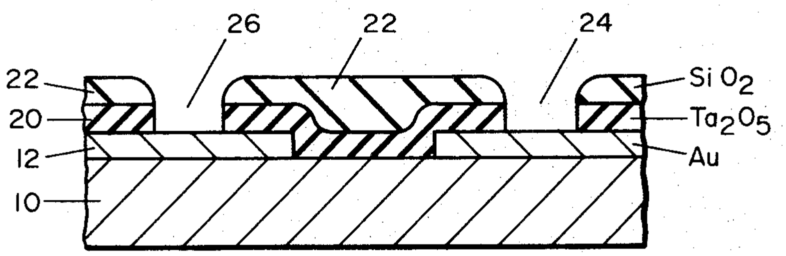

The tantalum layer 14 is covered with a layer of photoresist (not shown) as is well known in the arts to provide a mask so that the metal layer 14 may be etched. The tantalum layer 14 is about 100 to 1000 angstroms thick so that it can be easily etched at room temperature with a conventional metal etchant, for example, an etchant containing equal quantities of hydrofluoric acid and nitric acid to form the openings 16 and 18 as shown in FIG. 3. The photoresist layer (not shown) used to form the openings 16 and 18 is then removed. The tantalum layer 14 is oxidized at an elevated temperature to form the tantalum oxide layer 20. The tantalum oxide layer 20 is easily obtained by heating the device in an oxygen atmosphere at temperatures between 450° and 750° C.

The heating of the metal in an oxidizing atmosphere to form metal oxide results in some of the metal diffusing or migrating into the gold film thereby forming a more adherent bond. For example, some of the tantalum in layer 14 diffuses into gold layer 12 while the rest of the tantalum in layer 14 is being oxidized to form tantalum oxide. It is the diffusion at an elevated temperature of the tantalum into the gold film which is believed to cause the improved adherence between the gold film and the subsequent layer of glass. This invention is not limited to this theory, however.

A layer of glass or another dielectric 22 is deposited on top of the tantalum oxide layer 20. When silicon dioxide glass is used, a stream of silane and oxygen are passed over the wafer while the wafer is at an elevated temperature of 200 to 750° C. A layer of silicon dioxide is the preferred dielectric although aluminum oxide, silicon nitride and doped glasses may be used. Using conventional etching techniques, openings 24 and 26 are etched through the silicon dioxide layer 22. A metal contact or film (not shown) may be deposited in the openings 24 and 26 making contact to the gold film 12 to provide a multilayer metallization system suitable for use in integrated circuits.

In a preferred embodiment, gold is deposited in openings 24 and 26. This second layer of gold is protected from scratching, tweezer marking and probe markings by a coating of glass. The coating of glass is made to adhere to the gold layer by the use of the tantalum oxide bonding layer heretofore described.

What is claimed is:

1. A method for improving the adherence of glass to gold film comprising the steps of:

depositing a layer of a metal taken from the group consisting of tantalum, niobium, zirconium, titanium and hafnium on a layer of gold, heating the metal in the oxidizing atmosphere to convert the entire metal layer to a metal oxide layer, and depositing a layer of glass on top of said metal oxide layer.

2. A method as described in claim 1 wherein said metal is tantalum.

3. A method as described in claim 1 wherein said metal is deposited as a layer having a thickness of about 100 to 1000 Angstroms.

4. A method for improving adherence of glass to glass film comprising the steps of:

depositing a layer of metal taken from the group consisting of tantalum, niobium, zirconium, hafnium and titanium on a layer of gold;

forming selected openings in the metal layer whereby said gold layer is exposed;

heating the metal in an oxidizing atmosphere to convert the entire metal layer to a metal oxide layer;

depositing a layer of glass on top of said metal oxide and said exposed gold surface;

etching openings in said glass layer to expose the gold surface previously exposed, and;

depositing a metal selected from the group consisting of gold, tantalum, niobium, zirconium, hafnium and titanium in said openings on said exposed gold surface.

References Cited

UNITED STATES PATENTS

| | | | |
|---|---|---|---|
| 3,256,588 | 6/1966 | Sikina et al. | 117—217 |
| 3,268,773 | 8/1966 | Valley | 117—217 |
| 3,274,024 | 9/1966 | Hill et al. | 117—217 |
| 3,581,161 | 5/1971 | Cunningham et al. | 317—235/46.5 |
| 3,690,945 | 9/1972 | Kuisl | 317—235/46.5 |
| 3,698,946 | 10/1972 | Kaspaul et al. | 117—217 |

CAMERON K. WEIFFENBACH, Primary Examiner

U.S. Cl. X.R.

117—212, 70 A, 70 C; 156—3, 18, 24; 317